(12) United States Patent
Sato (10) Patent No.: US 11,681,386 B2
(45) Date of Patent: Jun. 20, 2023

(54) FLEXIBLE DECORATIVE LAMINATE SHEET, MODULE FOR TOUCH PANEL, AND TOUCH PANEL

(71) Applicant: Oike & Co., Ltd., Kyoto (JP)

(72) Inventor: Noriyuki Sato, Kyoto (JP)

(73) Assignee: OIKE & CO., LTD., Kyoto (JP)

( * ) Notice: Subject to any disclaimer, the term of this patent is extended or adjusted under 35 U.S.C. 154(b) by 612 days.

(21) Appl. No.: 16/657,621

(22) Filed: Oct. 18, 2019

(65) Prior Publication Data

US 2020/0159347 A1    May 21, 2020

(30) Foreign Application Priority Data

Nov. 15, 2018    (JP) .............................. JP2018-214849

(51) Int. Cl.
*G06F 3/041*    (2006.01)

(52) U.S. Cl.
CPC ........ *G06F 3/041* (2013.01); *B32B 2457/208* (2013.01)

(58) Field of Classification Search
CPC .... G06F 3/041; G06F 3/044; B32B 2457/208
See application file for complete search history.

(56) References Cited

U.S. PATENT DOCUMENTS

| 2012/0147584 A1* | 6/2012 | Wu ...................... G06F 3/0202 362/23.16 |
| 2012/0237723 A1 | 9/2012 | Wada |
| 2014/0016048 A1 | 1/2014 | Omote et al. |
| 2014/0036428 A1* | 2/2014 | Leong ................ H03K 17/9622 361/679.01 |
| 2015/0160760 A1 | 6/2015 | Sato |

(Continued)

FOREIGN PATENT DOCUMENTS

| JP | 2008-059913 A | 3/2008 |
| JP | 2012-192538 A | 10/2012 |
| WO | 2012132846 | 10/2012 |

OTHER PUBLICATIONS

Office Action issued in connection with European Patent application No. 19204133.3 from the European Patent Office dated Feb. 3, 2022.

(Continued)

*Primary Examiner* — George R Koch
*Assistant Examiner* — Christopher C Caillouet
(74) *Attorney, Agent, or Firm* — Christopher M. Scherer; DeWitt LLP (57) ABSTRACT

Provided is a flexible decorative laminate sheet that can be formed into a 3-dimensional formed body at one time, be smaller in weight owing to reduction in the number of members to be used, and be capable of simplifying a manufacturing process, a module for a touch panel, and a touch panel. The flexible decorative laminate sheet includes: a hard coat layer; a decorative layer having visible light transmissivity and electric charge transmissivity; and a conductive layer forming a touch sensor, wherein the hard coat layer, the decorative layer, and the conductive layer are arranged in the stated order, wherein an information display portion configured to display information when the touch sensor is activated is provided, and wherein the flexible decorative laminate sheet is formed into a 3-dimensional formed body through forming.

6 Claims, 3 Drawing Sheets

(56) References Cited

U.S. PATENT DOCUMENTS

2016/0018936 A1   1/2016  Su
2017/0139506 A1   5/2017  Rodriguez et al.

OTHER PUBLICATIONS

Extended European Search Report for EP/19204133.3, dated Mar. 19, 2020.
Office Action issued in connection with the Japanese Patent application No. 2018-214849, dated Sep. 7, 2021, from the JP Patent Office.

* cited by examiner

FLEXIBLE DECORATIVE LAMINATE SHEET, MODULE FOR TOUCH PANEL, AND TOUCH PANEL

CROSS-REFERENCE TO RELATED APPLICATIONS

The present application claims priority to Japanese Patent Application No. 2018-214849, filed Nov. 15, 2018, the content of which is incorporated herein by reference in its entirety.

TECHNICAL FIELD

The present invention relates to a flexible decorative laminate sheet, a module for a touch panel, and a touch panel. More in detail, the present invention relates to a flexible decorative laminate sheet that can be formed into a 3-dimensional formed body at one time, a module for a touch panel, and a touch panel.

BACKGROUND OF THE INVENTION

In recent years, with regard to capacitive touch panels, there have been known touch panels having a 2-dimensional shape and a 2.5-dimensional shape, such as a flat shape and a curved shape. In those touch panels, each of a cover lens and a decorative sheet, which have been shaped in advance, and a touch sensor are affixed to each other with, for example, an adhesive. Further, in a case of a touch panel having a more complicated 3-dimensional shape, a cover lens having been processed into a three-dimensional formed body in advance, a decorative sheet having been processed into a three-dimensional formed body in advance, and a touch sensor having been processed into a three-dimensional formed body are affixed to each other with, for example, an adhesive. In WO 2012/132846, there is disclosed a touch screen in which a cover lens and a touch sensor are separately processed into three-dimensional formed bodies and are affixed to each other.

SUMMARY OF THE INVENTION

However, with regard to such a touch panel having a 3-dimensional shape, it is required that, for example, a cover lens, a touch sensor, and a decorative sheet be separately processed into three-dimensional formed bodies in advance and then affixed to each other. Therefore, such a method involves increase in weight due to increase in the number of members to be used, and a manufacturing process thereof is complicated.

The present invention has been made in view of such a related-art invention, and has an object to provide a flexible decorative laminate sheet that can be formed into a 3-dimensional formed body at one time, be smaller in weight owing to reduction in the number of members to be used, and be capable of simplifying a manufacturing process, a module for a touch panel, and a touch panel.

As a result of extensive studies, the inventor of the present invention has found that the problem described above can suitably be solved by laminating a hard coat layer, a decorative layer, and a conductive layer that forms a touch sensor and forming a sheet having such flexibility that the sheet may be processed into a 3-dimensional formed body, and has completed the present invention. That is, the flexible decorative laminate sheet, the module for a touch panel, and the touch panel according to the present invention which solve the problem described above mainly include the following configurations.

(1) A flexible decorative laminate sheet, comprising: a hard coat layer; a decorative layer having visible light transmissivity and electric charge transmissivity; and a conductive layer forming a touch sensor, wherein the hard coat layer, the decorative layer, and the conductive layer are arranged in the stated order, wherein an information display portion configured to display information when the touch sensor is activated is provided, and wherein the flexible decorative laminate sheet is formed into a 3-dimensional formed body through forming.

According to such a configuration, the laminate sheet to be obtained has flexibility. Therefore, the laminate sheet including the hard coat layer, the decorative layer, and the conductive layer is deformed so as to be in conformity with a shape of the 3-dimensional formed body at one forming and is formed into the 3-dimensional formed body. As compared to the 3-dimensional formed body in the related art obtained by separately forming the layers into three-dimensional formed bodies in advance and affixing the layers to each other, the laminate sheet has a smaller number of components, is smaller in weight, and can be manufactured through a simpler manufacturing process.

(2) The flexible decorative laminate sheet according to (1), wherein a visible light blocking layer is provided between the decorative layer and the conductive layer.

According to such a configuration, in the laminate sheet, visible light is blocked by the visible light blocking layer. Therefore, for example, a pattern on the decorative layer becomes more likely to be visibly recognized, and hence the laminate sheet is excellent in design.

(3) The flexible decorative laminate sheet according to (2), wherein the visible light blocking layer has a first opening portion which penetrates through the visible light blocking layer in a thickness direction, and wherein the information display portion is the first opening portion.

According to such a configuration, in the laminate sheet, information is displayed on the first opening portion when the touch sensor is activated, and the information may be visually recognized well from outside.

(4) The flexible decorative laminate sheet according to (3), wherein the conductive layer has a second opening portion which penetrates through the conductive layer in a thickness direction, and wherein the first opening portion and the second opening portion communicate to each other.

According to such a configuration, in the laminate sheet, information is displayed through the first opening portion and the second opening portion when the touch sensor is activated, and the information may be visually recognized well from outside.

(5) The flexible decorative laminate sheet according to any one of (1) to (4), wherein the conductive layer includes conductive particles and a binder resin.

According to such a configuration, the laminate sheet is more likely to have flexibility and may tolerate processing into a 3-dimensional formed body having a more complicated shape.

(6) The flexible decorative laminate sheet according to any one of (1) to (5), wherein a resin layer is provided between the decorative layer and the visible light blocking layer.

According to such a configuration, not only the flexibility but also a suitable stiffness is given to the laminate sheet. With this, ease of handling the laminate sheet at the time of forming is likely to be improved.

(7) A module for a touch panel, comprising the flexible decorative laminate sheet of any one of (1) to (6) formed into a 3-dimensional formed body.

According to such a configuration, the module for a touch panel is a module in which the laminate sheet described above is deformed so as to be in conformity with a shape of the 3-dimensional formed body at one forming and formed into the 3-dimensional formed body. As compared to the related-art module obtained by separately forming the layers into three-dimensional formed bodies in advance and affixing the layers to each other, the module has a smaller number of components, is smaller in weight, and can be manufactured through a simpler manufacturing process. Moreover, the obtained module is processed into a predetermined shape that meets a customer's request and may be available to the market in such a shape. Thus, excellent convenience is attained.

(8) A touch panel, comprising: the module for a touch panel of (7); and a display body and/or a light-emitting body provided on the conductive layer side of the module for a touch panel.

According to such a configuration, with regard to the touch panel, when a touch sensor is activated, and the display body and/or the light-emitting body is turned on, information is displayed on the information display portion. The displayed information emerges in the decorative layer, which may give a visional impression to an observer.

According to the present invention, a flexible decorative laminate sheet that can be formed into a 3-dimensional formed body at one time, be smaller in weight owing to reduction in the number of members to be used, and be capable of simplifying a manufacturing process, a module for a touch panel, and a touch panel can be provided.

DETAILED DESCRIPTION

<Flexible Decorative Laminate Sheet>

Figure 1:
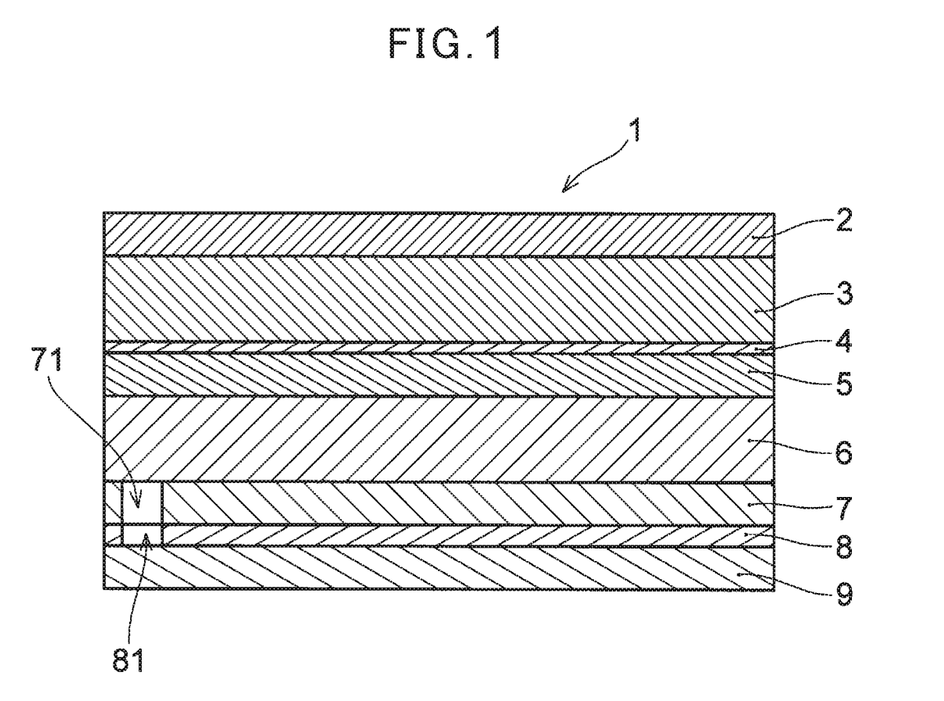
FIG. 1 is a schematic sectional view for illustrating a layer configuration of a laminate sheet according to one embodiment of the present invention.

A flexible decorative laminate sheet (hereinafter referred to also as "laminate sheet") according to one embodiment of the present invention includes: a hard coat layer; a decorative layer having visible light transmissivity and electric charge transmissivity; and a conductive layer forming a touch sensor. The hard coat layer, the decorative layer, and the conductive layer are arranged in the stated order. FIG. 1 is a schematic sectional view for illustrating a layer configuration of a laminate sheet 1 according to the present embodiment. More specifically, the laminate sheet 1 according to the present embodiment includes a hard coat layer 2, a first resin layer 3, a decorative layer 4, an adhesive layer 5, a second resin layer 6, a visible light blocking layer 7, a conductive layer 8, and a protective layer 9. The laminate sheet 1 includes an information display portion (first opening portion 71 described later) configured to display information when the touch sensor is activated. The laminate sheet 1 is formed into a 3-dimensional formed body through forming. Now, description is made of respective configurations of the layers.

(Hard Coat Layer 2)

A material forming the hard coat layer 2 is not particularly limited. Examples of the material forming the hard coat layer 2 include: thermosetting resins such as a polyester-based resin, an acryl-based resin, a polyurethane-based resin, and an epoxy-based resin; and photosetting resins (acryl-based resin and epoxy-based resin). Those resins may be used in combination. It is preferred that, among those resins, the material forming the hard coat layer 2 be the photosetting resin because the photosetting resin has hardness and flexibility and does not require high-temperature treatment for curing. It is more preferred that the material forming the hard coat layer 2 be the acryl-based resin.

A thickness of the hard coat layer 2 is not particularly limited. For example, it is preferred that the thickness of the hard coat layer 2 be equal to or larger than 1 µm, more preferably equal to or larger than 2 µm. Moreover, the thickness of the hard coat layer 2 be equal to or smaller than 50 µm, more preferably equal to or smaller than 20 µm. In the present embodiment, the hard coat layer 2 having a thickness of 5 µm is exemplified. When the thickness of the hard coat layer 2 falls within the range described above, the hard coat layer 2 is likely to have suitable stiffness and visible light transmissivity.

A forming method for the hard coat layer 2 is not particularly limited. For example, the hard coat layer 2 may be formed on one surface of the first resin layer 3 described later by a method such as gravure coating, die coating, or dipping.

(First Resin Layer 3)

The first resin layer 3 is preferably formed in the laminate sheet 1 according to the present embodiment. A material forming the first resin layer 3 is not particularly limited. Examples of the material forming the first resin layer 3 include thermoplastic resins such as a polyester-based resin, an acryl-based resin, a urethane-based resin, a polycarbonate-based resin, a polyolefin-based resin, a polyvinyl chloride-based resin, and a fluorocarbon-based resin. Those resins may be used in combination.

A thickness of the first resin layer 3 is not particularly limited. For example, it is preferred that the thickness of the first resin layer 3 be equal to or larger than 12 µm, more preferably equal to or larger than 25 µm. Moreover, it is preferred that the thickness of the first resin layer 3 be equal to or smaller than 5 mm, more preferably equal to or smaller than 3 mm. In the present embodiment, the first resin layer 3 having a thickness of 75 µm is exemplified. When the thickness of the first resin layer 3 falls within the range described above, the first resin layer 3 is likely to have suitable stiffness and flexibility.

A forming method for the first resin layer 3 is not particularly limited. The first resin layer 3 may be formed by any conventional well-known method.

(Decorative Layer 4)

The decorative layer 4 is a layer having decoration which may be visually recognized by an observer when the touch sensor is activated, and has visible light transmissivity and electric charge transmissivity. The decoration applied to the decorative layer 4 is not particularly limited. For example, the decorative layer 4 is a layer having decoration of a metallic pattern, a wood pattern, or a carbon pattern. When the decoration is a metallic pattern, such metallic pattern is formed of, for example, Al, Au, Ag, Cu, Cr, In, Ni, Sn, Ti, Zn, and an alloy thereof.

A forming method for the decorative layer 4 is not particularly limited. For example, the decorative layer 4 may be formed on another surface of the first resin layer 3 (surface opposite to the surface on which the hard coat layer 2 is formed) by, in the case of the metallic pattern, a physical vapor deposition (PVD) method such as vapor deposition or sputtering, or a printing method such as gravure printing, screen printing, or inkjet printing using a metallic pattern pigment, or by, in the case of the wood pattern or the carbon pattern, a printing method such as gravure printing, screen printing, or inkjet printing using pigments of various colors. Moreover, the decorative layer 4 may be formed by a transfer method of transferring the decoration.

A thickness of the decorative layer 4 is not particularly limited. For example, it is preferred that, when the decoration of the metallic pattern is applied by the physical vapor deposition (PVD) method such as vapor deposition or sputtering, the thickness of the decorative layer 4 be equal to or larger than 5 nm, more preferably equal to or larger than 20 nm. Moreover, it is preferred that the thickness of the decorative layer 4 be equal to or smaller than 100 nm, more preferably equal to or smaller than 80 nm. In the present embodiment, the decorative layer 4 having a thickness of 30 nm is exemplified. When the thickness of the decorative layer 4 falls within the range described above, the decorative layer 4 is likely to have excellent decoration applied thereto and have suitable visible light transmittance.

The decorative layer 4 in the present embodiment has visible light transmissivity and electric charge transmissivity. Therefore, the decorative layer 4 may have fine openings or have a material forming the decorative layer 4 present in dots. Accordingly, gaps are present at fine openings and at locations at which the material forming the decorative layer 4 are not present in dots, and hence the visible light is transmitted, and electric charges are also transmitted. Moreover, the decorative layer 4 may be, for example, a half mirror. The presence of such openings and material in dots, the decorative layer 4 may give various types of decoration. Therefore, the laminate sheet 1 is excellent in design.

A degree of the visible light transmissivity of the decorative layer 4 is not particularly limited. For example, with regard to the visible light transmissivity of the decorative layer 4 in the present embodiment, when a hazemeter (NDH7000, manufactured by NIPPON DENSHOKU INDUSTRIES Co., LTD) is used, a result of total light transmittance is from 1% to 60%. Similarly, a degree of the electric charge transmissivity of the decorative layer 4 is not particularly limited. The degree of electric charge transmissivity of the decorative layer 4 may be, as described later, such a degree that the touch sensor is activated when the touch sensor is traced with a human finger.

(Adhesive Layer 5)

The adhesive layer 5 is preferably provided so as to bond the decorative layer 4 and the second resin layer 6, which is described later, to each other. The adhesive layer 5 is not particularly limited. For example, the adhesive layer 5 is a binding agent, an adhesive, or a pressure sensitive adhesive (PSA).

A thickness of the adhesive layer 5 is not particularly limited. For example, the thickness of the adhesive layer 5 is from about 1 µm to about 500 µm. When the thickness of the adhesive layer 5 falls within the range described above, the decorative layer 4 and the second resin layer 6 are suitably bonded to each other.

(Second Resin Layer 6)

The second resin layer 6 is preferably provided between the decorative layer 4 and the visible light blocking layer 7, which is descried later. A material forming the second resin layer 6 is not particularly limited. Examples of the material forming the second resin layer 6 include thermoplastic resins such as a polyester-based resin, an acryl-based resin, a urethane-based resin, a polycarbonate-based resin, a polyolefin-based resin, a polyvinyl chloride-based resin, and a fluorocarbon-based resin. Those resins may be used in combination.

A thickness of the second resin layer 6 is not particularly limited. For example, it is preferred that the thickness of the second resin layer 6 be equal to or larger than 12 µm, more preferably equal to or larger than 25 µm. Moreover, it is preferred that the thickness of the second resin layer 6 be equal to or smaller than 5 mm, more preferably equal to or smaller than 3 mm. In the present embodiment, the second resin layer 6 having a thickness of 1.5 mm is exemplified. When the thickness of the second resin layer 6 falls within the range described above, the second resin layer 6 is likely to have suitable stiffness and flexibility.

A forming method for the second resin layer 6 is not particularly limited. The second resin layer 6 may be formed by any conventional well-known method.

(Visible Light Blocking Layer 7)

The visible light blocking layer 7 is preferably provided between the decorative layer 4 and the conductive layer 8, which is described later, and is configured to block the visible light so that, for example, the pattern on the decorative layer 4 is more likely to be visually recognized by an observer. A material forming the visible light blocking layer 7 is not particularly limited. Examples of the material forming the visible light blocking layer 7 include carbon black, a black pigment, a white pigment, and pigments of various colors. Those materials may be appropriately selected based on a desired blocking characteristic.

A thickness of the visible light blocking layer 7 is not particularly limited. For example, it is preferred that the thickness of the visible light blocking layer 7 be equal to or larger than 1 µm, more preferably equal to or larger than 2 µm. An upper limit of the thickness of the visible light blocking layer 7 is about 200 µm in consideration of, for example, flexibility. In the present embodiment, the visible light blocking layer 7 having a thickness of 5 µm is exemplified. When the thickness of the visible light blocking layer 7 falls within the range described above, in the laminate sheet 1, the visible light is appropriately blocked by the visible light blocking layer 7. Therefore, for example, the pattern of the decorative layer 4 is more likely to be visually recognized, and hence the laminate sheet 1 is excellent in design.

A forming method for the visible light blocking layer 7 is not particularly limited. For example, the visible light blocking layer 7 can be formed on one surface of the second resin layer 6 (surface opposite to the surface bonded to the adhesive layer 5) by a printing method such as gravure printing, screen printing, or inkjet printing, a PVD method such as vapor deposition or sputtering, a chemical vapor deposition (CVD) method, die coating, gravure coating, or dip coating.

It is preferred that the visible light blocking layer 7 in the present embodiment have the first opening portion 71 which penetrates through the visible light blocking layer 7 in a thickness direction. When such first opening portion 71 is formed, in the laminate sheet 1, the first opening portion 71 functions as an information display portion when the touch sensor is activated, and information is displayed. At this time, the displayed information is visually recognized as if the information emerges from the inner side of the decorative layer 4. As a result, through the first opening portion 71, an observer may visually recognize the displayed information well and may recognize the excellent design at the same time.

A dimension of the first opening portion 71 is not particularly limited. The dimension of the first opening portion 71 may be appropriately adjusted in accordance with, for example, a desired size of information.

A method of forming the first opening portion 71 in the visible light blocking layer 7 is not particularly limited. For example, the first opening portion 71 may be formed in the visible light blocking layer 7 by screen printing.

(Conductive Layer 8)

The conductive layer 8 forms the touch sensor. The conductive layer 8 is not particularly limited. For example, it is preferred that conductive layer 8 include conductive particles and a binder resin. With this, the conductive layer 8 may have suitable flexibility while maintaining excellent conductivity.

The conductive particles are not particularly limited. Examples of the conductive particles include Ag particles, thin leaf-like Ag particles, Al particles, Cu particles, and ITO particles. Moreover, in place of the conductive particles and the binder resin, there may be provided, for example, a conductive polymer, a carbon nanotube (CNT), graphene, and a metal nanowire (MNW). The conductive particles may be used in combination. Among those, it is preferred that the conductive particles be Ag particles and thin leaf-like Ag particles in view of electric resistivity. Alternatively, it is also preferred that the conductive particles be Cu particles in view of migration.

The binder resin is not particularly limited. Examples of the binder resin include an alkyd resin, a polyester resin, an unsaturated polyester resin, a polyurethane resin, an acrylic resin, an epoxy resin, a phenol resin, a vinyl resin, a silicone resin, a fluorocarbon resin, a phthalic acid resin, an amino resin, a polyamide resin, a polyacrylic silicone resin, a melamine resin, a urea resin, and modified resins thereof. The binder resins may be used in combination.

A blend ratio (mass ratio) of the conductive particles and the binder resin is not particularly limited. For example, it is preferred that the blend ratio of the conductive particles and the binder resin be 40 to 180:100, more preferably 60 to 160:100. When the blend ratio falls within the range described above, the conductive layer 8 is likely to achieve both excellent conductivity and flexibility.

A thickness of the conductive layer 8 is not particularly limited. For example, it is preferred that the thickness of the conductive layer 8 be equal to or larger than 100 nm. Moreover, it is preferred that the thickness of the conductive layer 8 be equal to or smaller than 20 μm, more preferably equal to or smaller than 10 μm. In the present embodiment, the conductive layer 8 having a thickness of 5 μm is exemplified. When the thickness of the conductive layer 8 falls within the range described above, the conductive layer 8 is likely to achieve suitable sheet resistivity and adhesiveness.

A method of forming the conductive layer 8 is not particularly limited. For example, the conductive layer 8 can be formed on one surface of the visible light blocking layer 7 (surface opposite to the surface bonded to the second resin layer 6) by a printing method such as gravure printing, screen printing, or inkjet printing, a PVD method such as vapor deposition or sputtering, a CVD method, die coating, gravure coating, or dip coating. In particular, when a mesh-like pattern is formed as the conductive layer 8, there may be adopted a method of forming a pattern through gravure printing, screen printing, or inkjet printing and thereafter performing patterning through laser etching or photolithography. The patterning of the mesh-like pattern is not essentially required. In order to give a position detection function, the conductive layer 8 may be patterned into a rhombic pattern. In this case, the conductive layer 8 may have a first rhombic conductive layer and a second rhombic conductive layer which are insulated from each other.

When the first opening portion 71 is formed in the visible light blocking layer 7 described above, it is preferred that the conductive layer 8 in the present embodiment have a second opening portion 81 which penetrates through the conductive layer 8 in a thickness direction and communicates to the first opening portion 71. When such second opening portion 81 is formed, in the laminate sheet 1, the first opening portion 71 and the second opening portion 81 function as an information display portion when the touch sensor is activated, and information is displayed. At this time, the displayed information is visually recognized as if the information emerges from the inner side of the decorative layer 4. As a result, through the first opening portion 71 and the second opening portion 81, an observer may visually recognize the displayed information well and may recognize the excellent design at the same time.

A dimension of the second opening portion 81 is not particularly limited. The dimension of the second opening portion 81 may be appropriately adjusted in accordance with, for example, a desired size of information.

A method of forming the second opening portion 81 in the conductive layer 8 is not particularly limited. For example, the second opening portion 81 may be formed in the conductive layer 8 by screen printing.

(Protective Layer 9)

The protective layer 9 is preferably provided in the laminate sheet 1 according to the present embodiment. A material forming the protective layer 9 is not particularly limited. Examples of the material forming the protective layer 9 include thermosetting resins such as a polyester-based resin, an acryl-based resin, a polyurethane-based resin, and an epoxy-based resin, and photosetting resins (acryl-based resin and epoxy-based resin). Those resins may be used in combination. It is preferred that, among those resins, the material forming the protective layer 9 be a photosetting resin and a thermosetting resin because those resins achieve wire protection and have flexibility. It is more preferred that the material forming the protective layer 9 be an acryl-based resin.

A thickness of the protective layer 9 is not particularly limited. For example, it is preferred that the thickness of the protective layer 9 be equal to or larger than 1 μm, more preferably equal to or larger than 10 μm. Moreover, it is preferred that the thickness of the protective layer 9 be equal to or smaller than 200 μm, more preferably equal to or smaller than 100 μm. In the present embodiment, the protective layer 9 having a thickness of 40 μm is exemplified. When the thickness of the protective layer 9 falls within the range described above, the protective layer 9 may suitably protect the conductive layer 8, in particular, at the time of forming into the 3-dimensional formed body and from external damage.

A method of forming the protective layer 9 is not particularly limited. For example, the protective layer 9 may be formed on one surface of the conductive layer 8 (surface opposite to the surface bonded to the visible light blocking layer 7) by a printing method such as gravure printing, screen printing, or inkjet printing, a PVD method such as vapor deposition or sputtering, a CVD method, die coating, gravure coating, or dip coating.

Returning to description of the entire laminate sheet 1, a manufacturing method for laminate sheet 1 according to the present embodiment is not particularly limited. For example, the laminate sheet 1 may be manufactured by laminating the layers described above in a roll-to-roll method and integrating the layers, or by forming the layers into sheets having a predetermined size and then laminating and integrating the layers. Besides, for example, the hard coat layer 2, the first resin layer 3, and the decorative layer 4 described above may be integrated to form a first film, and the second resin layer 6, the visible light blocking layer 7, the conductive layer 8, and the protective layer 9 described above may be integrated to form a second film. The first film and the second film may be integrated to each other through intermediation of the adhesive layer 5 described above. Moreover, for example, the visible light blocking layer 7, the conductive layer 8, and the protective layer 9 may be sequentially formed on the first film obtained by integrating the hard coat layer 2, the first resin layer 3, and the decorative layer 4 described above.

The obtained laminate sheet 1 is formed into a 3-dimensional formed body. The laminate sheet 1 according to the present embodiment has flexibility. Therefore, the laminate sheet 1 may be deformed so as to be in conformity with a shape of the 3-dimensional formed body by forming at one time and formed into a 3-dimensional formed body. Such a formed sheet has a smaller number of components, is smaller in weight, and can be manufactured through a simpler manufacturing process as compared to a 3-dimensional formed body of the related art obtained by separately forming layers into the three-dimensional formed bodies in advance and affixing the layers to each other.

<Module for Touch Panel>

A module for a touch panel (hereinafter referred to also as "module") according to one embodiment of the present invention is a module in which the laminate sheet 1 described above is formed into a 3-dimensional formed body.

A method of forming into a 3-dimensional formed body is not particularly limited. FIGS. 2A to 2D are schematic process views for illustrating a method of forming into a 3-dimensional formed body (module 10) according to the present embodiment. As exemplified in FIG. 2A, the laminate sheet 1 which is sandwiched at both ends is heated by a heater 11 and softened. It is preferred that, in order to appropriately soften the layers without damage, a heating temperature be from about 60° C. to about 200° C.

Figure 2A:
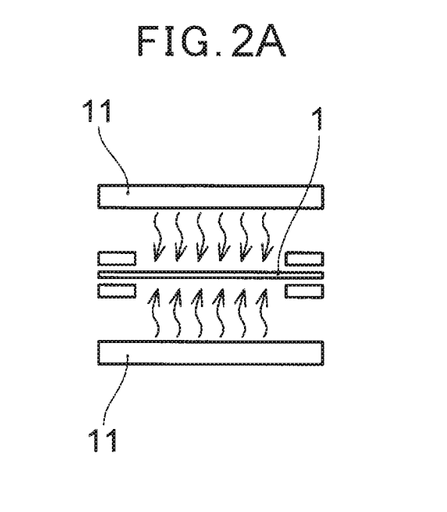
FIGS. 2A to 2D are schematic process views for illustrating a method of forming into a 3-dimensional formed body according to one embodiment of the present invention.
Figure 2B:
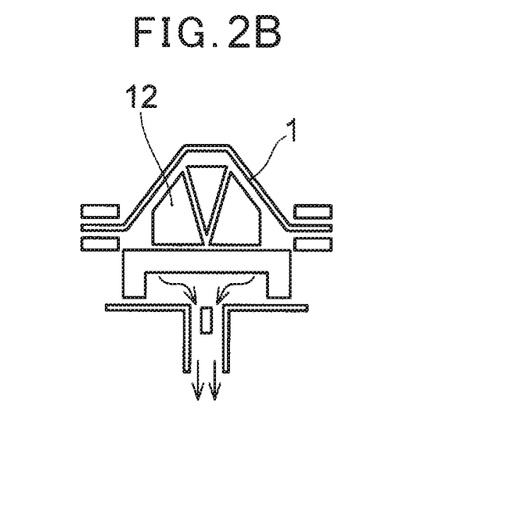
Figure 2C:
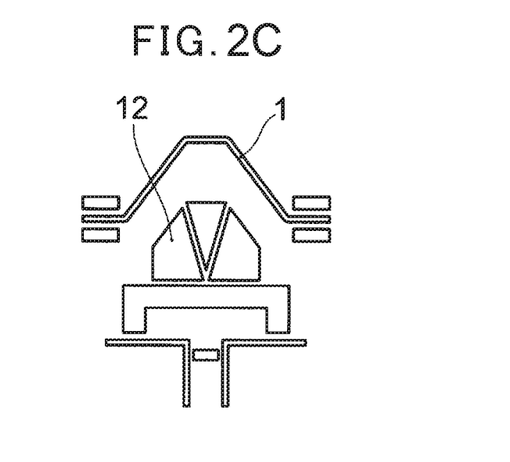
Figure 2D:
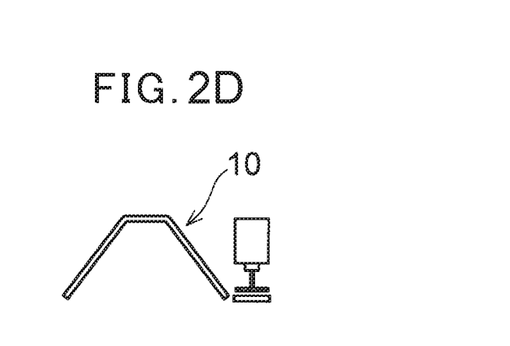

Next, as exemplified in FIG. 2B, the heated laminate sheet 1 is pressed against a die 12 having a desired 3-dimensional shape under vacuum suction. With this, the laminate sheet 1 is deformed so as to be in conformity with the shape of the 3-dimensional formed body through forming at one time. Then, as exemplified in FIG. 2C, the laminate sheet 1 is formed into a desired shape, is cured, and is separated from the die 12. After that, as exemplified in FIG. 2D, unnecessary portions are removed from the laminate sheet 1. With this, the laminate sheet 1 is processed into a module 10 formed into the 3-dimensional formed body. The forming of the laminate sheet 1 may be performed by a method other than the vacuum suction. For example, the forming may be performed through pressure forming, insert forming, or an OMD method (vacuum pressure film coating method).

As described above, the module 10 according to the present embodiment is a module which is obtained by deforming the laminate sheet 1 described above so as to be in conformity with the shape of the 3-dimensional formed body by forming at one time to form the laminate sheet 1 into the 3-dimensional formed body. Such module 10 has a smaller number of components, is smaller in weight, and can be manufactured through a simpler manufacturing process as compared to a module of the related art obtained by separately forming layers into three-dimensional formed bodies in advance and affixing the layers to each other. Moreover, the obtained module 10 is processed into a predetermined shape that meets a customer's request and may be available to the market in such a shape. Thus, excellent convenience is attained.

<Touch Panel>

Figure 3:
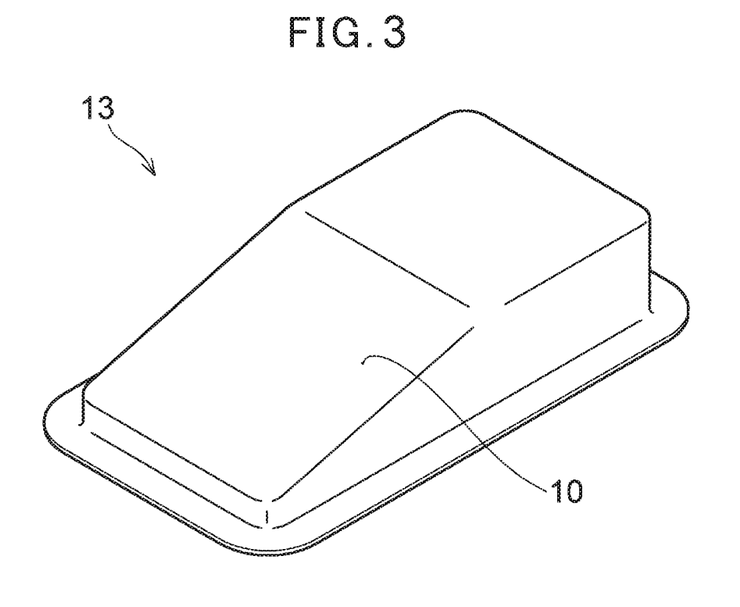
FIG. 3 is a schematic perspective view for illustrating a touch panel according to one embodiment of the present invention.
Figure 4:
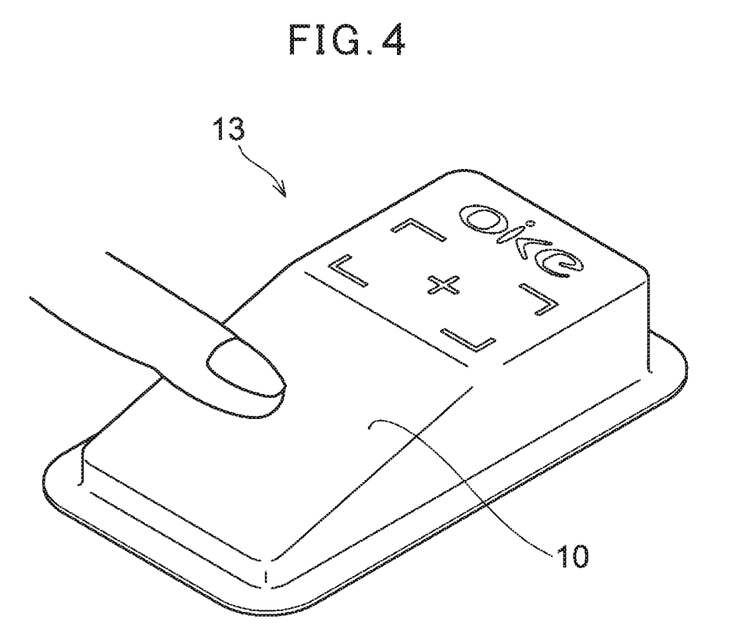
FIG. 4 is a schematic perspective view for illustrating the touch panel according to one embodiment of the resent invention.

A touch panel according to one embodiment of the present invention is a touch panel including the module described above and a display body or a light-emitting body provided on the conductive layer side of the module. FIG. 3 and FIG. 4 are schematic perspective views of a touch panel 13 according to the present embodiment. FIG. 3 is an illustration of a state in which the touch sensor is not activated, and FIG. 4 is an illustration of a state in which the touch sensor is activated. The touch panel may include both of the display body and the light-emitting body.

In FIG. 3 and FIG. 4, the display body or the light-emitting body as well as a well-known member required for a typical touch panel (for example, various electronic circuits and a power supply) are provided, and the module 10 and the light-emitting body or the display body are electrically connected to each other with various electronic circuits. Moreover, through use of an IC substrate provided in the electronic circuit, the light-emitting body or the display body is controlled so as to turn on when the touch sensor of the module 10 is activated. The light-emitting body or the display body is not particularly limited. Examples of the light-emitting body or the display body include an LED, an LCD, an organic EL, an inorganic EL, a CCFL, and a reflective display.

As exemplified in FIG. 3, under a state in which the touch sensor is not activated, only the metallic decoration of the decorative layer is visually recognized on the touch panel 13. Meanwhile, as exemplified in FIG. 4, for example, when an observer touches the module with a finger to activate the touch sensor, necessary information is displayed as if emerging in the metallic decoration of the decorative layer and is visually recognized, which may give a visional impression to the observer.

Use of the touch panel 13 according to the present embodiment is not particularly limited. The touch panel 13 according to the present embodiment may be widely applicable to, for example, a vehicle instrumental panel (for example, a touch panel display), various home electric appliances, electronic tables, PC devices, mobile devices, amusement devices, game devices, interiors, construction materials, illuminations, show windows, show cases, and wall switches.

REFERENCE SIGNS LIST 1 laminate sheet
2 hard coat layer
3 first resin layer
4 decorative layer
5 adhesive layer
6 second resin layer
7 visible light blocking layer
71 first opening portion 8 conductive layer
81 second opening portion
9 protective layer
10 module
11 heater
12 die
13 touch panel

What is claimed is:

1. A flexible decorative laminate sheet, comprising:
a hard coat layer;
a decorative layer having visible light transmissivity and electric charge transmissivity;
a conductive layer forming a touch sensor,
wherein the hard coat layer, the decorative layer, and the conductive layer are arranged in the stated order,
wherein a visible light blocking layer is provided between the decorative layer and the conductive layer,
wherein the decorative layer is the layer having decoration of a metallic pattern,
wherein the decorative layer has a material forming the decorative layer present in dots,
wherein an information display portion configured to display information when the touch sensor is activated is provided,
wherein the visible light blocking layer has a first opening portion which penetrates through the visible light blocking layer in a thickness direction,
wherein the information display portion is the first opening portion, and
wherein the flexible decorative laminate sheet is formed into a 3-dimensional formed body through forming.

2. The flexible decorative laminate sheet according to claim 1,
wherein the conductive layer has a second opening portion which penetrates through the conductive layer in a thickness direction, and
wherein the first opening portion and the second opening portion communicate to each other.

3. The flexible decorative laminate sheet according to claim 1, wherein the conductive layer includes conductive particles and a binder resin.

4. The flexible decorative laminate sheet according to claim 1, wherein a resin layer is provided between the decorative layer and the visible light blocking layer.

5. A module for a touch panel, comprising the flexible decorative laminate sheet of claim 1 formed into a 3-dimensional formed body.

6. A touch panel, comprising:
the module for a touch panel of claim 5; and
a display body and/or a light-emitting body provided on the conductive layer side of the module for a touch panel.

* * * * *